(12) United States Patent
Endo et al.

(10) Patent No.: US 6,468,603 B1
(45) Date of Patent: Oct. 22, 2002

(54) PLASMA FILM FORMING METHOD UTILIZING VARYING BIAS ELECTRIC POWER

(75) Inventors: Shunichi Endo, Tokyo-To (JP); Tadashi Hirata, Funabashi (JP)

(73) Assignee: Tokyo Electron Limited, Tokyo-to (JP)

( * ) Notice: Subject to any disclaimer, the term of this patent is extended or adjusted under 35 U.S.C. 154(b) by 0 days.

(21) Appl. No.: 09/663,715

(22) Filed: Sep. 18, 2000

Related U.S. Application Data

(63) Continuation of application No. PCT/JP99/05041, filed on Sep. 16, 1999.

(30) Foreign Application Priority Data

Sep. 18, 1998 (JP) .......................................... 10-283471

(51) Int. Cl.$^7$ .............................................. C23C 16/26
(52) U.S. Cl. ....................... 427/577; 427/571; 427/575; 427/249.1; 438/780
(58) Field of Search ................................ 427/577, 571, 427/575, 249.1; 438/780

(56) References Cited

U.S. PATENT DOCUMENTS 6,215,087 B1 * 4/2001 Akahori et al. ........ 204/298.02

FOREIGN PATENT DOCUMENTS

| JP | 8-222557 | 8/1996 |
| JP | 10-144675 | 5/1998 |
| JP | 10-172965 | 6/1998 |

OTHER PUBLICATIONS

Endo et al., Mat. Res. Soc. Symp. Proc., vol. 381, 1995.*

* cited by examiner

*Primary Examiner*—Timothy Meeks
(74) *Attorney, Agent, or Firm*—Finnegan, Henderson, Farabow, Garrett & Dunner LLP

(57) ABSTRACT

This invention is a method of: making a film-forming gas including a compound gas of carbon and fluorine into plasma in a vacuum container 2 including a stage 4 for an object to be processed 10; and applying a bias electric power to the stage 4 in order to draw ions in the plasma toward the object 10 while forming an insulation film consisting of a film of fluorine-added carbon onto the object 10 by the plasma. At first, a first electric power of the bias electric power is applied to the stage 4 and the compound gas of carbon and fluorine is introduced at a first flow rate to form the film of fluorine-added carbon onto the object 10. Then, a second electric power of the bias electric power smaller than the first electric power is applied to the stage 4 and the compound gas of carbon and fluorine is introduced at a second flow rate smaller than the first flow rate to form the film of fluorine-added carbon onto the object 10. According to the invention, in the case of filling up a concave portion having a high aspect ratio with a film of fluorine-added carbon, the film-forming process can be conducted while generating less voids with a raised throughput.

6 Claims, 3 Drawing Sheets

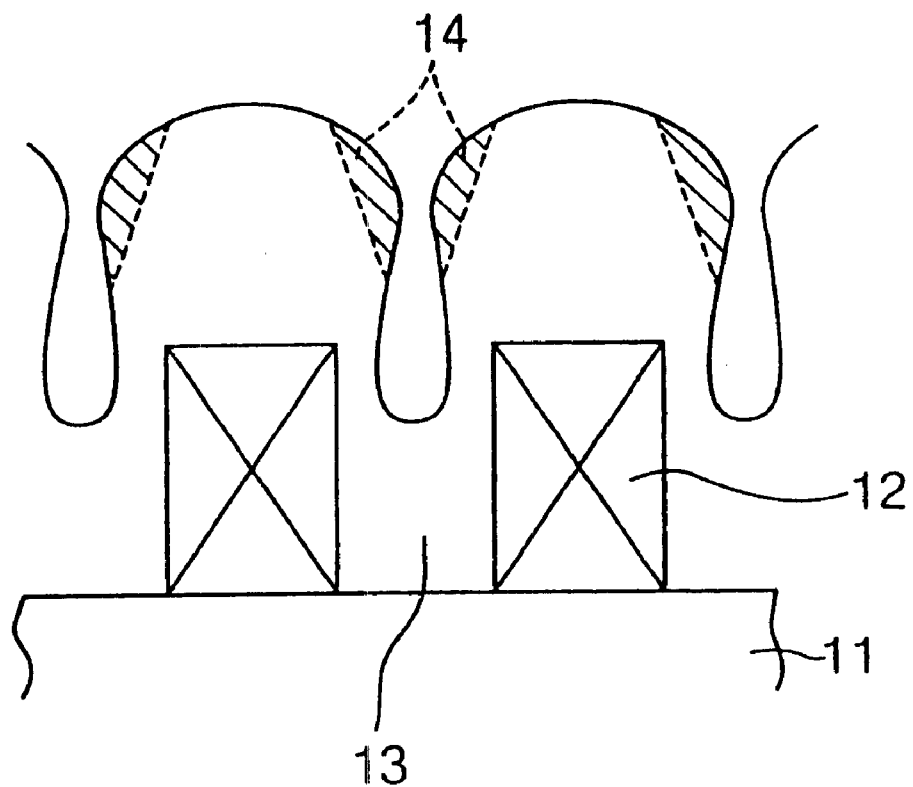
F I G. 3

PLASMA FILM FORMING METHOD UTILIZING VARYING BIAS ELECTRIC POWER

CROSS REFERENCE TO RELATED APPLICATION

This application is a Continuation of International Application No. PCT/JP99/05041, filed Sep. 16, 1999.

FIELD OF THE INVENTION

This invention relates to a method for forming a film of carbon added fluorine (fluorine-added carbon), which is for example used for an interlayer dielectric film of a semiconductor device.

BACKGROUND OF THE INVENTION

In order to integrate semiconductor devices in higher density, various ideas have been proposed, for example, making patterns minute or multilayering circuits. As one of the ideas, there is known an art for multilayering wires. In order to achieve a multilayered wiring structure, an (n)-th wiring layer and an (n+1)-th wiring layer are connected with each other via an electric conducting layer. In addition, a thin film, which is called an interlayer dielectric film, is formed at an area or areas except the electric conducting layer.

An $SiO_2$ film is a typical interlayer dielectric film. However, recently, it is required to lower a dielectric constant of the interlayer dielectric film in order to raise a speed of operation of the device further more. Then, characteristics of materials for the interlayer dielectric films are examined and studied. The $SiO_2$ has a dielectric constant of about 4. Thus, various efforts have been made to find or form a material having a smaller dielectric constant. As one of the efforts, an SiOF film having a dielectric constant of 3.5 has been developed. However, inventors of this invention have paid attention to a film of fluorine-added carbon (hereafter, which is abbreviated as a CF film) having a further smaller dielectric constant.

If such a CF film is used as an interlayer dielectric film, for example as shown in FIG. 3, if such a CF film fills up a gap between aluminum wires 12, 12 of a circuit board which has a $SiO_2$ film 11 on that the wires 12 are formed, a plasma unit is used for generating plasma, for example by using electron cyclotron resonance. In addition, for example, Ar gas is used as a plasma gas, and a mixed gas including a compound gas of carbon (C) and fluorine (F) and a hydrocarbon gas is used as a film-forming gas. Then, the film-forming gas is made into plasma to accumulate a CF film 13 on a surface of the $SiO_2$ film 11.

While accumulating, as shown in FIG. 3, shoulder-like portions 14 of the accumulated film above both side edges of a concave portion 13 between the wires 12, 12 bulge out. Then, the shoulder-like portions 14 may contact with each other to block access to the concave portion 13. Thus, a bias electric power is applied to a stage for a wafer in order to draw plasma ions (Ar ions) perpendicularly toward the wafer. Thus, the portions blocking the access to the concave portion 13 are removed by a sputter-etching effect of the Ar ions while the film is formed.

In addition, in a real process to fill up the gap between the wires 12, 12 with the CF film according to the above method, the bias electric power for forming the CF film is divided into two stages in order to prevent generating voids. For example, the bias electric power in the first stage is 1.5 kW, the bias electric power in the second stage is 1.0 kW (which is smaller than that in the first stage), and other conditions to conduct the process are the same. In the case, in the first stage, since the bias electric power is larger, etching effect of the Ar ions is so strong that the portions blocking the access to the concave portion 13 are removed enough to fill up the concave portion 13 with the CF film. Then, when the concave portion 13 is filled up with the CF film, the first stage comes to an end. Then, the second stage starts. In the second stage, since the bias electric power is smaller, film-forming effect is stronger than etching effect. Thus, the CF film is formed at a higher speed in an area above the wires 12.

SUMMARY OF THE INVENTION

However, voids may be generated and good filling up may not be achieved if the CF film fills up a gap between wires having an aspect ratio (height of wires/gap between wires) of not less than 3, even if, according to the method described above, the etching effect and the film-forming effect are adjusted by the bias electric power in such a manner that the etching effect is stronger in the first stage and that the film-forming effect is stronger in the second stage.

This invention is intended to solve the above problem. The object of this invention is to provide a plasma film-forming method which can satisfactory fill up a concave portion having a high aspect ratio with a CF film as an insulating film.

In order to achieve the object, a plasma film-forming method of: making a film-forming gas including a compound gas of carbon and fluorine into plasma in a vacuum container including a stage for an object to be processed; and applying a bias electric power to the stage in order to draw ions in the plasma toward the object while forming an insulation film consisting of a film of fluorine-added carbon onto the object by the plasma; comprises: a first step of applying a first electric power of the bias electric power to the stage and supplying the compound gas of carbon and fluorine at a first flow rate to form the film of fluorine-added carbon onto the object; and a second step of applying a second electric power of the bias electric power smaller than the first electric power to the stage and supplying the compound gas of carbon and fluorine at a second flow rate smaller than the first flow rate to form the film of fluorine-added carbon onto the object.

Preferably, the film-forming gas includes a hydrocarbon gas.

Preferably, the film-forming gas is made into plasma by means of electron cyclotron resonance of a microwave and a magnetic field.

Preferably, the object has wires, the first step is conducted until the wires of the object are covered by the film of fluorine-added carbon, and the second step is conducted after the wires of the substrate are covered by the film of fluorine-added carbon.

BRIEF DESCRIPTION OF THE DRAWINGS

FIG. 3 is a sectional view for explaining a conventional state filled with a CF film.

DESCRIPTION OF THE PREFERRED EMBODIMENT

Figure 1:
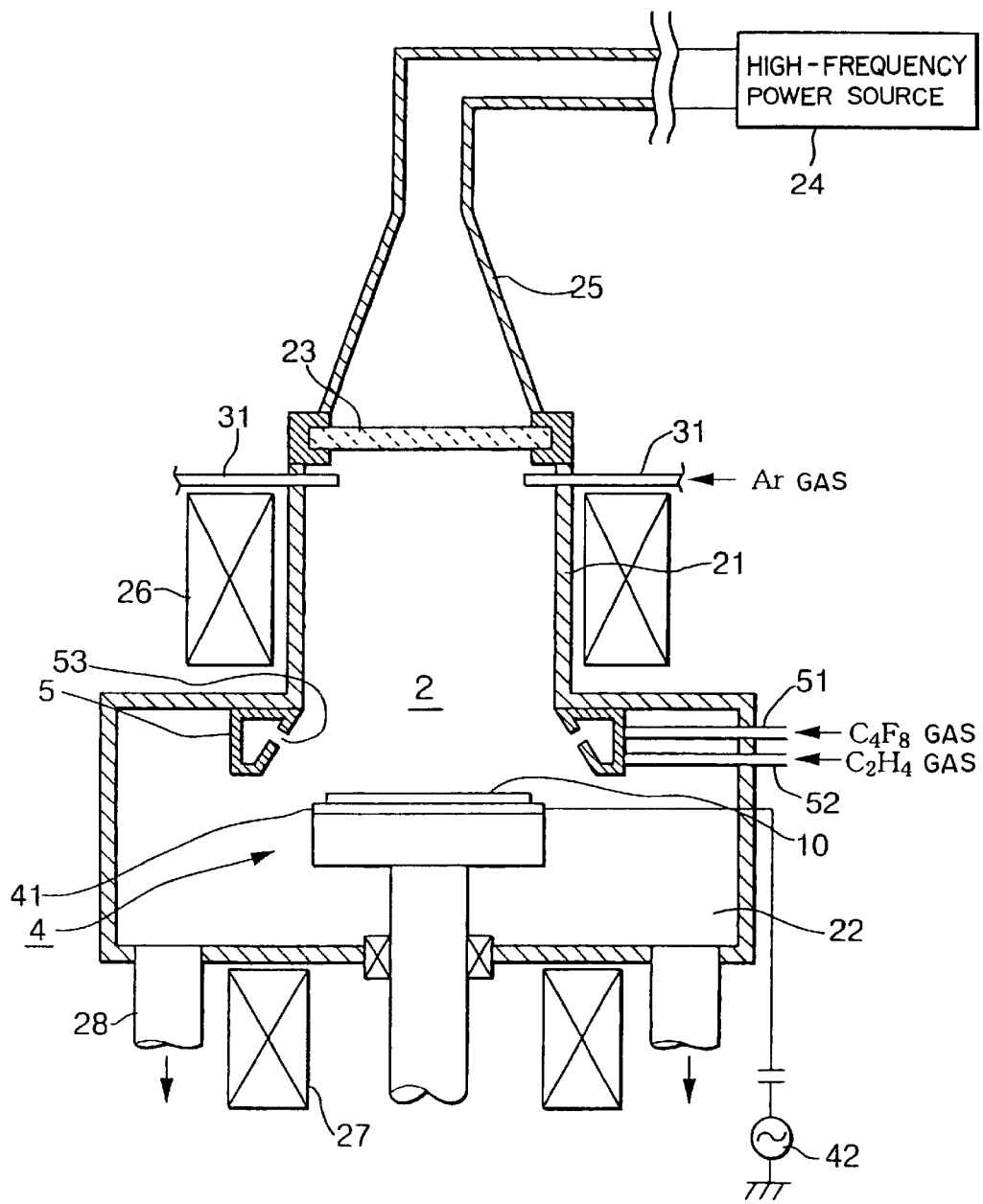
FIG. 1 is a vertical sectional view of an example of a plasma film-forming unit for carrying out a method according to the invention.

At first, an example of a plasma film-forming unit used in an embodiment according to the invention is shown in FIG.

1. The unit includes a vacuum container 2 made of for example aluminum or the like. The vacuum container 2 includes a first cylindrical vacuum chamber 21 located in an upper portion thereof for generating plasma, and a second cylindrical vacuum chamber 22 having a diameter larger than that of the first vacuum chamber 21. The second vacuum chamber 22 is arranged under and connected to the first vacuum chamber 21. In addition, the vacuum container 2 is grounded to be in zero potential.

An upper end of the vacuum container 2 has an opening. A penetrable window 23 made of a microwave penetrable material such as a crystal is sealingly fitted in the opening. Thus, an inside of the vacuum container 2 can be maintained at a vacuum. A wave guide 25 is provided outside of the penetrable window 23. The wave guide 25 is connected to a high-frequency power source 24, which can generate a microwave of for example 2.45 GHz. Then, the microwave generated by the high-frequency power source 24 is introduced via the wave guide 25 by for example a TE mode. Alternatively, the microwave guided by the TE mode is converted to a TM mode in the wave guide 25, and the converted microwave can be introduced into the first vacuum chamber 21 through the penetrable window 23.

A plurality of gas nozzles 31 are arranged around a side wall defining the first vacuum chamber 21, for example at substantially regular intervals in a peripheral direction thereof. The plurality of gas nozzles 31 are connected to a gas source such as a plasma-generating gas source not shown. Thus, a plasma-generating gas such as Ar gas can be uniformly supplied into an upper portion of the first vacuum chamber 21.

A stage 4 for a semiconductor wafer 10 (hereafter, which is abbreviated as a wafer) as an object to be processed is arranged in the second vacuum chamber 22 to face the first vacuum chamber 21. The stage 4 has an electrostatic chuck 41 in a surface portion thereof. Electrodes of the electrostatic chuck 41 are connected to a direct-current power source (not shown) for sticking to the wafer and to a high-frequency power source 42 for applying a bias electric power (bias-potential) to draw ions up to the wafer.

A circular film-forming-gas supplying member 5 is provided at an upper portion of the second vacuum chamber 22, that is, at a connecting portion of the second vacuum chamber 22 and the first vacuum chamber 21. A compound gas of C and F (a CF gas) as a firm-forming gas, for example $C_4F_8$ gas and a hydrocarbon gas, for example $C_2H_4$ gas are supplied from a gas-supplying tube 51 and a gas-supplying tube 52 into the film-forming-gas supplying member 5, respectively. Then, the film-forming-gas supplying member 5 is adapted to supply these gases into the vacuum container 2 via gas holes 53 which are formed in an inside surface thereof.

A magnetic-field forming means such as a circular main electromagnetic coil 26 is arranged around and near to the side wall defining the first vacuum chamber 21. A circular auxiliary electromagnetic coil 27 is arranged below the second vacuum chamber 22. Exhausting pipes 28 are connected to a base plate of the second vacuum chamber 22, for example at two positions symmetric with respect to a central axis of the vacuum chamber 22.

Figure 2:
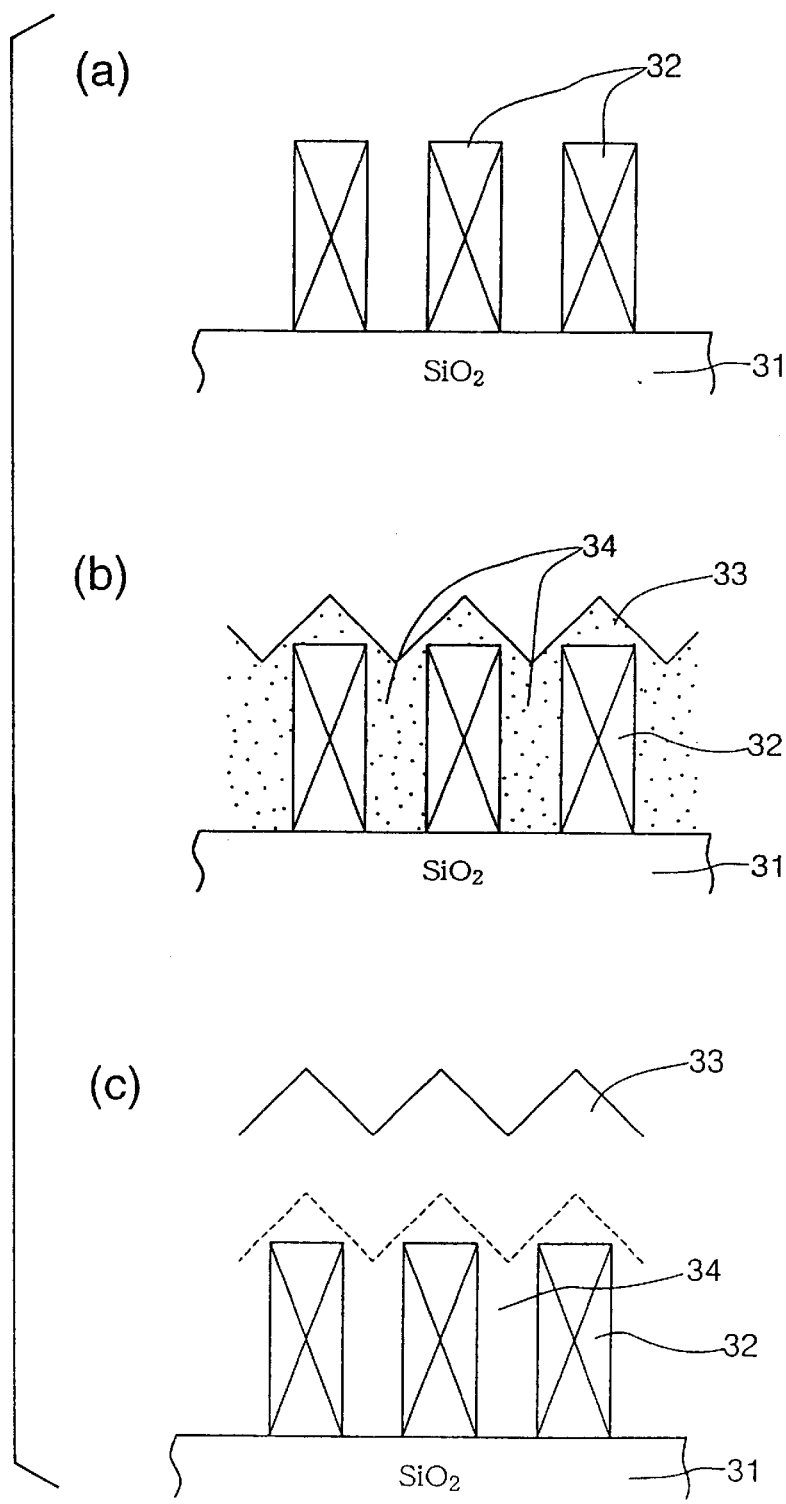
FIG. 2 is a process flow chart for explaining states filled with a CF film.

Then, a series of processes for filling up gaps between wires formed on the wafer 10 with an interlayer dielectric film consisting of a CF film by using the above unit is explained with reference to FIG. 2. In the case, each wire has a height of 6000 angstrom, each gap has a width of 1500 angstrom, thus the gaps have an aspect ratio of 4. In the series of processes, the CF film is formed in two separate steps. That is, by adjusting a bias electric power (the high-frequency power source 42) and a flow rate of the CF gas, etching effect is adjusted to be stronger in the first step and film-forming effect is adjusted to be stronger in the second step.

At first, a gate valve (not shown) provided at a side wall of the second vacuum chamber 22 whose volume is about 53 little is opened. A conveying arm (not shown) conveys the wafer 10 having a $SiO_2$ film 31, on whose surface aluminum wires 32 are formed, from a load-lock chamber (not shown) onto the stage 4 via the gate valve. The wafer 10 conveyed onto the stage 4 is electrostaticly adhered to the electrostatic chuck 41. Then, the first step for forming a CF film 33 on the surface of the $SiO_2$ film 31 is started (see FIG. 2(b)).

That is, the gate valve is closed, and the inside of the vacuum container 2 is hermetically closed. Then, gas of the inside of the vacuum container 2 is exhausted from the exhausting pipes 28, so that the inside of the vacuum container 2 is produced to a predetermined vacuum such as 0.5 Pa. A process temperature is adjusted to for example 400° C. Then, the Ar gas is introduced into the first vacuum chamber 21 through the gas nozzles 31 at a flow rate of for example 150 sccm. At the same time, the $C_4F_8$ gas is introduced from the film-forming gas supplying member 5 into the second vacuum chamber 22 at a first flow rate of for example 100 sccm, and the $C_2H_4$ gas is introduced from the film-forming gas supplying member 5 into the second vacuum chamber 22 at a flow rate of for example 20 sccm. Then, the high-frequency wave (microwave) of 2.45 GHz and 2.4 kW is supplied by the high-frequency power source 24, and a bias voltage of 13.56 MHz and 1.5 kW (first electric power) is applied to the stage 4 by the high-frequency power source 42.

Thus, the microwave from the high-frequency power source 24 is introduced into the first vacuum chamber 21 through the wave guide 25 and through the penetrable window 23 at the ceiling of the vacuum container 2. In the vacuum container 2, the main electromagnetic coil 26 and the auxiliary electromagnetic 27 form a mirror magnetic field in a direction from an upper portion of the first vacuum chamber 21 toward a lower portion of the second vacuum chamber 22. For example, a strength of the magnetic field at a lower portion of the first vacuum chamber 21 is 875 gauss.

An electric cyclotron resonance is generated by an interaction between the magnetic field and the microwave. The resonance causes the Ar gas to become plasma and to be more dense. Since the plasma is made of Ar gas, the plasma is more stable.

The plasma flows from the first vacuum chamber 21 into the second vacuum chamber 22 and activates (makes into plasma) the $C_4F_8$ gas and the $C_2H_4$ gas, which are supplied thereinto, to produce activated species (plasma).

Ar ions, that are plasma ions, are drawn toward the wafer 10 by the bias electric potential for drawing the plasma. Then, the sputter-etching effect of the Ar ions cut off edges of the CF film accumulated on a pattern (concave portion) of the surface of the wafer 10 in order to enlarge an opening for access to the concave portion. Thus, the CF film is formed and fills up the concave portion.

The first step described above is carried out, for example for 20 seconds, to sufficiently fill up concave portions 34 between wires 32, 32 with the CF film 33, that is, to accumulate the CF film up to the vicinity of upper ends of the wires 32, as shown in FIG. 2(b).

After that, as shown in FIG. 2(c), the second step for forming the CF film is carried out. That is, under a condition the same as the first step with respect to the high-frequency electric power (high-frequency power source 24), a shape of the magnetic field, the process temperature, the process pressure, the flow rate of the Ar gas, and the flow rate of the $C_2H_4$ gas, the bias electric power is set to a second electric power, for example 1.0 kW, that is smaller than the first electric power. In addition, a flow rate of the $C_4F_8$ gas is set to a second flow rate, for example 80 sccm, that is smaller than the first flow rate. Then, similarly to the first step, the CF film is formed for a predetermined time, that is, until a predetermined thickness of the CF film is obtained.

In a case of manufacturing actual devices, after that, the CF film may be etched with a predetermined pattern. For example, W films may fill up the etched grooves to form circuits of W.

In the above film-forming method, there are the etching effect and the film-forming effect at the same time. However, in the first step, since the bias electric power is set to be larger than that in the second step, drawing power of the Ar ions to the wafer 10 is stronger. Thus, the sputter-etching effect is greater.

In addition, in the first step, since the flow rate of the $C_4F_8$ gas is set to be larger than that in the second step, the etching effect is further stronger. It is guessed that this may be caused by F in the plasma made of the $C_4F_8$ gas reacting with C of the CF film to generate a CF gas and by the CF gas chemically etching the CF film 33. Thus, it may be thought that if the flow rate of the $C_4F_8$ gas is larger, the etching effect is stronger.

As described above, in the first step, since the bias electric power is larger and the flow rate of the $C_4F_8$ gas is larger, the etching effect is stronger. Thus, by the etching effect, upper areas of the concave portions 34 are enlarged, although bottom areas of the concave portions 34 are smaller. Thus, by the film-forming effect existing with the etching effect, the CF film may be easily accumulated in the bottom areas of the concave portions 34. Thus, by the CF film filling the bottom areas of the concave portions 34, a depth of the concave portions 34 gradually becomes shallow. Thus, even if the concave portions 34 have a high aspect ratio, the concave portions may be satisfactorily filled with the CF film while forming less voids.

However, in the second step, the bias electric power is smaller than that in the first step and the flow rate of the $C_4F_8$ gas is smaller than that in the first step. Thus, the etching effect is smaller, but the film-forming effect is greater. For example, a film-forming speed is about 2000 angstrom/ minute in the first step, but a film-forming speed is about 4000 angstrom/minute in the second step, which is twice as great as that in the first step. Thus, the CF film may be formed on the upper area of the wires 32 at a higher film-forming speed. That is, film-forming time for the area may become shorter.

If the flow rate of the $C_4F_8$ gas is kept as the same as that in the first step, the etching effect by the $C_4F_8$ gas is kept stronger and a film-forming speed is kept smaller. Thus, film-forming time to obtain a desired thickness of the film may become longer, that is, throughput of the film-forming process may become worse.

As described above, in the first step, the flow rate of the $C_4F_8$ gas is preferably set to be large. However, if the flow rate of the $C_4F_8$ gas is too much, the etching effect may be too strong. In the case, shoulder portions of the wires 32 may be cut off, or a film-forming speed may become too small, that is, throughput of the film-forming process may become too bad. In addition, a volume of F in the CF film may be so much that thermal stability of the CF film may become worse. Therefore, the flow rate of the $C_4F_8$ gas can not be set more than a certain level. Herein, bad thermal stability means that if the CF film is heated to a high temperature, an F-gas such as F, CF, or $CF_2$ tends to break away from the CF film. If the F-gas breaks away from the CF film, metal wires may be corroded and/or electromigration may be generated.

In addition, in the second step, the flow rate of the $C_4F_8$ gas is preferably set to be smaller than that in the first step. However, if a volume of F in the CF film is too small, an insulating characteristic of the CF film may become worse, or a dielectric constant of the CF film may rise. Thus, it is necessary to obtain the CF film including a suitable volume of F. Therefore, the flow rate of the $C_4F_8$ gas can not be set less than another certain level.

A suitable range of the flow rate of the $C_4F_8$ gas in the first step or in the second step may be determined based on the kind of CF gas, the volume of the vacuum container 2, the process pressure or the like. In the above embodiment, the flow rate of the $C_4F_8$ gas in the first step is preferably about 100 to 120 sccm, and the flow rate of the $C_4F_8$ gas in the second step is preferably about 60 to 80 sccm.

As described above, in the method of the invention, in consideration for the chemical etching effect of the CF gas, the strength of the etching effect and the strength of the film-forming effect are adjusted by controlling the bias electric power and the flow rate of the CF gas. Thus, the concave portions 34 may be satisfactorily filled with the CF film while generating less voids, even if the concave portions 34 have a high aspect ratio not less than 3 and it is difficult to satisfactorily fill the concave portion with the CF film by the conventional method, that is, by adjusting the strength of the etching effect and the strength of the film-forming effect only through controlling the bias electric power. In addition, in the second step, the CF film is formed and accumulated to a predetermined thickness at a higher film-forming speed. Thus, as for the total film-forming process, even if the CF film fills up the concave portions having a high aspect ratio, the film-forming process may be carried out at a raised throughput while generating less voids.

Next, experiments conducted for confirming effects of the invention are explained. In the experiments, as shown in FIG. 1, the plasma film-forming unit, whose vacuum container has the volume of 63 little, was used. Each of the experiments was conducted to a wafer 10 on which wires had been formed in such a manner that each wire has a height of 6000 angstrom, each gap between two adjacent wires has a width of 1500 angstrom, thus the gaps have an aspect ratio of 4. The first step for forming the CF film was carried out for 20 seconds, wherein the $C_4F_8$ gas was introduced at 100 sccm (the first flow rate), the $C_2H_4$ gas was introduced at 20 sccm, and the Ar gas was introduced at 150 sccm, respectively. At that time, the microwave electric power was 2.4 kW, the bias electric power was 1.5 kW (the first electric power), the shape of magnetic field was a mirror magnetic field, the process temperature was 400° C., and the process pressure was 0.5 Pa. Then, the wires of the object to be processed were covered by the CF film. Next, the $C_4F_8$ gas was introduced at 80 sccm (the second flow rate), and the bias electric power was changed to 1.0 kW (the second electric power). The other conditions were kept the same as the first step, and the second step for forming the CF film was carried out until a thickness of the CF film become 0.9 μm, that is, for 125 seconds (Example 1). As a result, the film-forming speed in the first step was 2000 angstrom/ minute, and the film-forming speed in the second step was 4000 angstrom/minute.

In addition, the plasma film-forming unit shown in FIG. 1 was used for a comparison as well. The first step for forming the CF film was carried out for 20 seconds, wherein the $C_4F_8$ gas was introduced at 80 sccm, the $C_2H_4$ gas was introduced at 20 sccm, the Ar gas was introduced at 150 sccm, the microwave electric power was 2.4 kW, the bias electric power was 1.5 kW, the shape of magnetic field was a mirror magnetic field, the process temperature was 380° C., and the process pressure was 0.45 Pa. Next, the bias electric power was changed to 1.0 kW. The other conditions were kept the same as the first step, and the second step for forming the CF film was carried out until a thickness of the CF film become 0.9 µm, that is, for 120 seconds (Comparison 1).

The CF film by the example 1 described above and the CF film by the comparison 1 described above were examined whether there were voids or not by a SEM (Scanning Electron Microscope). Consequently, there were substantially no conspicuous voids in the concave portions between the wires in the CF film of the example 1. However, there were conspicuous voids having a size of about 500 angstrom in the CF film of the comparison 1.

In addition, similar experiments for filling the concave portions with the CF film were conducted to a wafer 10 on which wires had been formed in such a manner that gaps between the wires have an aspect ratio of 5 (example 2), and to a wafer 10 on which wires had been formed in such a manner that gaps between the wires have an aspect ratio of 6 (example 3). Consequently, substantially no conspicuous voids were formed in the concave portions between the wires. The results confirmed that when the CF film is formed in a process according to the invention, the concave portions having a high aspect ration might be satisfactorily filled with the CF film.

In addition, a similar experiment was conducted to a wafer 10, on which wires had been formed in such a manner that gaps between the wires have an aspect ratio of 4, with a changed process pressure and a changed flow rate of the film-forming gas. In the case, the first step for forming the CF film was carried out for 30 seconds, wherein the $C_4F_8$ gas was introduced at 120 sccm (the first flow rate), the $C_2H_4$ gas was introduced at 20 sccm, the Ar gas was introduced at 200 sccm, the microwave electric power was 2.4 kW, the bias electric power was 1.5 kW (the first electric power), the shape of magnetic field was a mirror magnetic field, the process temperature was 380° C., and the process pressure was 0.7 Pa. Next, the $C_4F_8$ gas was introduced at 80 sccm (the second flow rate), and the bias electric power was changed to 1.0 kW (the second electric power). The other conditions were kept the same as the first step, and the second step for forming the CF film was carried out until a thickness of the CF film become 0.9 µm, that is, for 141 seconds (Example 4). The CF film of the example was also examined whether there were voids or not therein. Consequently, there were substantially no conspicuous voids in the concave portions between the wires.

In addition, a similar experiment was conducted to a wafer 10, on which wires had been formed in such a manner that gaps between the wires have an aspect ratio of 4, by using the $C_4F_8$ gas as a CF gas and by using $H_2$ gas instead of a hydrocarbon gas. In the case, the first step for forming the CF film was carried out for 20 seconds, wherein the $C_4F_8$ gas was introduced at 80 sccm (the first flow rate), the $H_2$ gas was introduced at 60 sccm, the Ar gas was introduced at 150 sccm, the microwave electric power was 2.7 kW, the bias electric power was 0.6 kW (the first electric power), the shape of magnetic field was a mirror magnetic field, the process temperature was 300° C., and the process pressure was 0.18 Pa. Next, the $C_4F_8$ gas was introduced at 60 sccm (the second flow rate), and the bias electric power was changed to 0.3 kW (the second electric power). The other conditions were kept the same as the first step, and the second step for forming the CF film was carried out until a thickness of the CF film become 0.9 µm, that is, for 125 seconds (Example 5). The CF film of the example was also examined whether there were voids or not therein. Consequently, there were substantially no conspicuous voids in the concave portions between the wires.

In the above examples, a compound gas of C and F such as $CF_4$ gas, $C_2F_6$ gas, $C_3F_8$ gas, $C_5F_8$ gas or $C_6F_6$ gas, and a gas including not only C and F but also H such as $CHF_3$ gas can be used as a CF gas. As a hydrocarbon gas, $CH_4$ gas, $C_2H_2$ gas, $C_2H_6$ gas, $C_3H_8$ gas or the like can be used. In addition, instead of the hydrocarbon gas, hydrogen gas can be used.

In addition, this invention is not limited by the manner of generating plasma by ECR. For example, this invention may be applied to a case of generating plasma by a method called ICP (Inductive Coupled Plasma) wherein a coil wound around a dome-like container gives an electric field and a magnetic field to a process gas. This invention may also be applied to a case of generating plasma by an interaction of a helicon wave of for example 13.56 MHz and a magnetic field formed by a magnetic coil, which plasma is called helicon-wave plasma. This invention may also be applied to a case of generating plasma by applying a magnetic field to two parallel cathodes in a substantially parallel manner, which plasma is called magnetron plasma. This invention may also be applied to a case of generating plasma by applying a high-frequency electric power between electrodes facing with each other, which are called parallel-plates.

What is claimed is:

1. A method for applying bias electric power in a plasma film-forming method in which a plasma of film-forming gas including a compound gas of carbon and fluorine is formed in a vacuum container including a stage for an object to be processed, to draw ions in the plasma toward the object while forming an insulation film consisting of fluorine-added carbon onto the object, the method comprising:

applying a first electric power of the bias electric power to the stage and supplying the compound gas of carbon and fluorine at a first flow rate to form the film of fluorine-added carbon onto the object; and applying a second electric power of the bias electric power smaller than the first electric power to the stage and supplying the compound gas of carbon and fluorine at a second flow rate smaller than the first flow rate to form the film of fluorine-added carbon onto the object.

2. A plasma film-forming method according to claim 1, wherein:

the film-forming gas includes a hydrocarbon gas.

3. A plasma film-forming method according to claim 1, wherein:

the film-forming gas is made into plasma by means of electron cyclotron resonance of a microwave and a magnetic field.

4. The method for applying bias electric power of claim 1, wherein the object has wires, the first electric power is applied until the wires of the object are covered by the film of fluorine-added carbon, and the second electric power is applied after the wires of the object are covered by the film of fluorine-added carbon.

5. A plasma film-forming method according to claim 1, wherein:

the film forming gas includes a hydrogen gas.

6. A plasma film-forming method according to claim 1, wherein:

the compound gas of carbon and fluorine includes one of $CF_4$ gas, $C_2F_6$ gas, $C_3F_8$ gas, $C_5F_8$ gas, $C_6F_6$ gas and $CHF_3$ gas.

* * * * *